(12) United States Patent
Parekh et al.

(10) Patent No.: US 7,411,255 B2
(45) Date of Patent: Aug. 12, 2008

(54) DOPANT BARRIER FOR DOPED GLASS IN MEMORY DEVICES

(75) Inventors: Kunal R. Parekh, Boise, ID (US); Gurtej Singh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 11/003,138

(22) Filed: Dec. 3, 2004

(65) Prior Publication Data

US 2005/0151179 A1 Jul. 14, 2005

Related U.S. Application Data

(62) Division of application No. 10/233,279, filed on Aug. 29, 2002, now Pat. No. 6,833,575.

(51) Int. Cl.
*H01L 29/76* (2006.01)

(52) U.S. Cl. ............... 257/390; 257/296; 257/758; 257/E21.28; 257/E23.16

(58) Field of Classification Search ............ 257/295, 257/296, 390, 758
See application file for complete search history.

(56) References Cited

U.S. PATENT DOCUMENTS

| | | | |
|---|---|---|---|
| 4,045,302 A | 8/1977 | Gibbs et al. | |
| 4,789,426 A | 12/1988 | Pipkin | |
| 4,886,765 A | 12/1989 | Chen et al. | |
| 4,956,313 A | 9/1990 | Cote et al. | |
| 5,225,372 A | 7/1993 | Savkar et al. | |
| 5,262,354 A | 11/1993 | Cote et al. | |
| 5,381,046 A * | 1/1995 | Cederbaum et al. | 257/760 |
| 5,719,072 A | 2/1998 | Sugiura et al. | |
| 5,915,175 A | 6/1999 | Wise | |
| 6,026,465 A * | 2/2000 | Mills et al. | 711/103 |
| 6,147,014 A * | 11/2000 | Lyding et al. | 438/798 |
| 6,156,630 A | 12/2000 | Iyer | |
| 6,204,172 B1 | 3/2001 | Marsh | |
| 6,387,726 B1 | 5/2002 | Verlinden et al. | |
| 6,524,918 B2 * | 2/2003 | Park et al. | 438/287 |
| 6,531,730 B2 | 3/2003 | Sandhu et al. | |
| 6,534,809 B2 * | 3/2003 | Moise et al. | 257/295 |
| 6,579,796 B2 | 6/2003 | Ying et al. | |
| 6,602,117 B1 | 8/2003 | Chopra et al. | |
| 6,784,503 B2 * | 8/2004 | Shimizu et al. | 257/390 |
| 6,833,575 B2 * | 12/2004 | Parekh et al. | 257/296 |
| 7,132,371 B2 | 11/2006 | Parekh et al. | |
| 2002/0096771 A1 * | 7/2002 | Yamada et al. | 257/758 |
| 2003/0045082 A1 | 3/2003 | Eldridge et al. | |
| 2005/0032314 A1 | 2/2005 | Parekh et al. | |

* cited by examiner

*Primary Examiner*—Dao H. Nguyen
(74) *Attorney, Agent, or Firm*—Schwegman, Lundberg & Woessner, P.A.

(57) ABSTRACT

A semiconductor device has a diffusion barrier formed between a doped glass layer and surface structures formed on a substrate. The diffusion barrier includes alumina and optionally a nitride, and has a layer thickness satisfying the high aspect ratio of the gaps between the surface structures, while adequately preventing dopants in doped glass layer from diffusing out of the doped glass layer to the surface structures and the substrate. Further, heavy water can be used during the formation of the alumina so that deuterium may be accomplished near the interface of surface structures and the substrate to enhance the performance of the device.

52 Claims, 15 Drawing Sheets

DOPANT BARRIER FOR DOPED GLASS IN MEMORY DEVICES

This application is a Divisional of U.S. application Ser. No. 10/233,279, filed Aug. 29, 2002, now U.S. Pat. No. 6,833,575, which is incorporated herein by reference.

FIELD

The present invention relates generally to integrated circuits, and in particular, to dielectric structures in semiconductor devices.

BACKGROUND

Semiconductor devices reside in many electrical products to operate as resistors, capacitors, transistors, memory cells, and other components. A typical semiconductor device has many surface structures formed above a substrate and many active regions formed within the substrate. The surface structures and the active regions act together to form the function of the semiconductor device.

A dielectric layer is usually blanketed over the surface structures and the substrate to insulate them from other circuit layers within the semiconductor device. Glass is usually the material for this kind of dielectric layer.

During manufacturing, the glass layer (dielectric layer) is first deposited. Next, a reflow (melting) process is performed to flatten the surface of the glass layer. Today, the glass is usually doped with materials such as boron and phosphorous (dopants) to reduce the temperature of the reflow process. Thus, a doped glass has one or more dopant materials. The dopant in the doped glass, however, tends to diffuse outward and migrate to the surface structures and the substrate. This outward diffusion may change the electrical properties of the surface structures, the active regions in the substrate, the substrate itself, and hence, the performance of the device.

Most devices now have a barrier layer sandwiched between the doped glass layer and the surface structures to prevent the migration of the dopant from the doped glass layer to the surface structures and the substrate.

Silicon nitride has been suggested as the material for the barrier layer. However, the device formed by the surface structures and the active regions may suffer from underalloy due to hydrogen blocking properties. Static retention time may decrease when silicon nitride is used on a silicon substrate. This may be caused by stress, interface build up, or fixed charge.

Further, today, with increasing aspect ratio (depth to width ratio) of the gaps between the surface structures (for example, narrower gaps), the barrier layer is limited to a certain layer thickness in these gaps. With this layer thickness limitation, silicon nitride and other tetraethooxysilane (TEOS) materials may not be thick enough to prevent the outward diffusion of the dopant in the doped glass.

Thus, there is a need for an alternative barrier layer.

SUMMARY OF THE INVENTION

The present invention provides structures and methods for an improved dopant barrier layer for doped glass.

One aspect offers a semiconductor device including a substrate with a surface structure formed over it. An alumina layer is formed on and conforming to the surface structure and the substrate. A doped glass layer is formed over the alumina layer. The semiconductor device further includes an insulating layer formed between doped glass layer and the surface structure and the substrate.

Another aspect provides a method of forming a device. The method includes forming an alumina layer on multiple surface structures and a substrate of the memory device. The method also includes covering the alumina layer with a doped glass layer. The method further includes planarizing the doped glass layer.

DESCRIPTION OF EMBODIMENTS

Figure 1A:
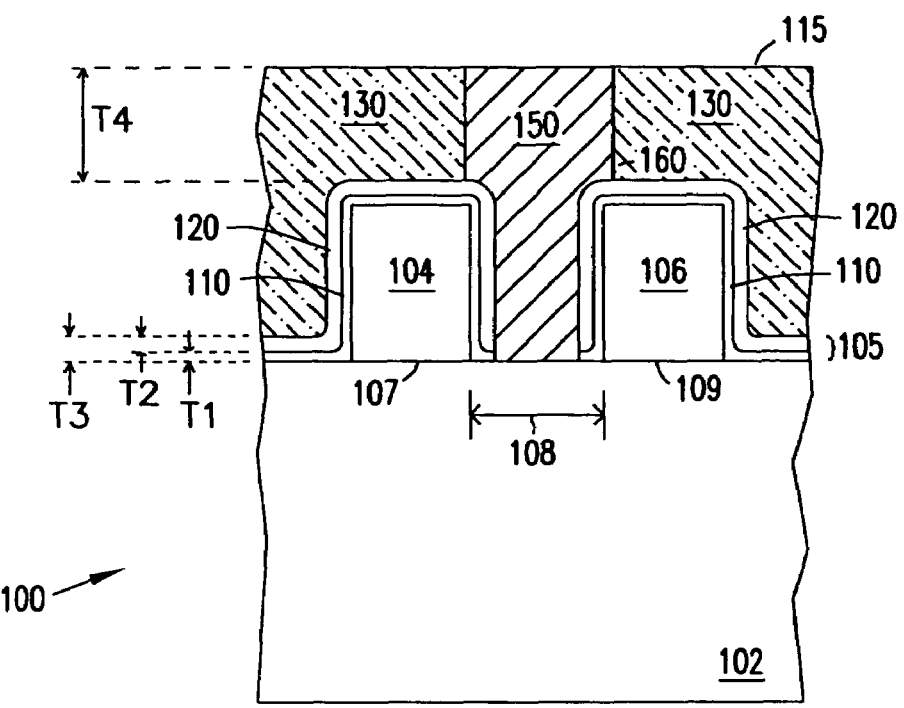
FIG. 1A is a cross-section of a semiconductor device according to an embodiment of the invention.

The following description and the drawings illustrate specific embodiments of the invention sufficiently to enable those skilled in the art to practice it. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1A is a cross-section of a part of a semiconductor device according to an embodiment of the invention. Device 100 includes a substrate 102 and surface structures 104 and 106 formed on substrate 102 at interfaces 107 and 109. Surface structures 104 and 106 are separated from each other by a gap 108, which has a height (or depth) H and a width W. Device 100 can be any kind of device such as a dynamic random access memory (DRAM) device, a static random access memory device (SRAM), a flash memory device, a processor, an application specific integrated circuit (ASIC), or other semiconductor devices.

Substrate 102 can be a silicon wafer or any other conventional structure that is used as a base to form circuits. Surface structures 104 and 106 include semiconductor material, such as polysilicon, and can perform certain functions by themselves or in combination with structures in substrate 102. For example, surface structures 104 and 106 can be gate structures of transistors, in which these gate structures together with structures in substrate 102 form transistors and memory cells a memory device.

Device 100 further includes a diffusion barrier 105 and a doped glass layer 130, all formed over surface structures 104 and 106 and substrate 102. Diffusion barrier 105 includes an alumina ($Al_2O_3$) layer 110 and insulating layer 120. Alumina layer 110 conforms to surface structures 104 and 106 and substrate 102. Insulating layer 120 conforms to alumina layer 110. The bottom surface of doped glass layer 130 conforms to insulating layer 120. A top surface 115 of doped glass layer 130 is planarized (flat). In some embodiments, top surface 115 can be other shapes. Insulating layer 120 can include silicon nitride ($Si_3N_4$), silicon dioxide ($SiO_2$), or other insulating materials.

In embodiments represented by FIG. 1A, insulating layer 120 is formed over alumina layer 110. In some embodiments, insulating layer 120 can be formed under alumina layer 110. In other embodiments, insulating layer 120 is omitted.

Alumina layer 110 has a thickness T1. In some embodiments, T1 is in the range of about 20 to about 200 Angstroms. Insulating layer 120 has a thickness T2. In some embodiments, T2 is in the range of about 20 to about 200 Angstroms. In other embodiments, diffusion barrier 105 has a thickness T3 in the range of about 20 to about 400 Angstroms. Doped glass layer 130 can be a silicate glass doped with one or more dopants such as boron and phosphorous, or other type of doped glass. For example, doped glass layer 130 can be Boronsilicate glass (BSG), or Phosphosilicate glass (PSG). In FIG. 1, doped glass layer 130 includes Borophosphosilicate glass (BPSG) and has a thickness T4. In some embodiments, T4 is in the range of 2000 to 12000 Angstroms.

Device 100 also includes a contact structure 150 formed in a self aligned contact 160 which extends through doped glass layer 130 and diffusion barrier 105 to substrate 102. Contact structure 150 provides electrical connection to active regions (not shown) formed within substrate 102.

The aspect ratio of gap 108 is the ratio between the height H and the width W (H/W). A maximum thickness of a layer formed in gap 108 is limited by the aspect ratio of the gap. In some cases, without using alumina, a diffusion barrier 105 with a maximum allowable thickness may not be enough to prevent the diffusion of dopant from doped glass layer to surface structures 104 and 106 and substrate 102. Thus, in these cases, including alumina layer 110 as a part of diffusion barrier 105 provides enough protection while staying within the maximum allowable thickness. In some embodiments, including alumina layer 110 as a part of diffusion barrier 105 increases the "width" remaining in gap 108 after the formation of diffusion barrier 105, thereby allowing more room for the formations of other elements in the gap.

Alumina layer 110 and insulating layer 120 prevent dopant such as boron and phosphorous from doped glass layer 130 to diffuse to surface structures 104 and 106 and substrate 102.

In some processes during the formation of device 100, a hydrogen atom bonds with a silicon atom at interface 107 between surface structure 104 and substrate 102 and at interface 109 between surface structure 106 and substrate 104. This hydrogen and silicon bond provides a certain electrical property at interfaces 107 and 109. Other processes during the formation of device 100 may break the hydrogen and silicon bond and replace the hydrogen atom with another atom. The new atom may change the electrical property at interfaces 107 and 109 and may degrade the operation of device 100 over time. Alumina layer 110 reduces replacement of the hydrogen atom by another atom at the hydrogen and silicon bond, to maintain the electrical property at the interfaces.

In some embodiments, heavy water $D_2O$ (deuterium oxide) instead of regular water $H_2O$ used in the deposition of alumina layer 110 provides a source of deuterium near interfaces 107 and 109. The source of deuterium near interfaces 107 and 109 maintains the electrical property at these interfaces.

Figure 1B:
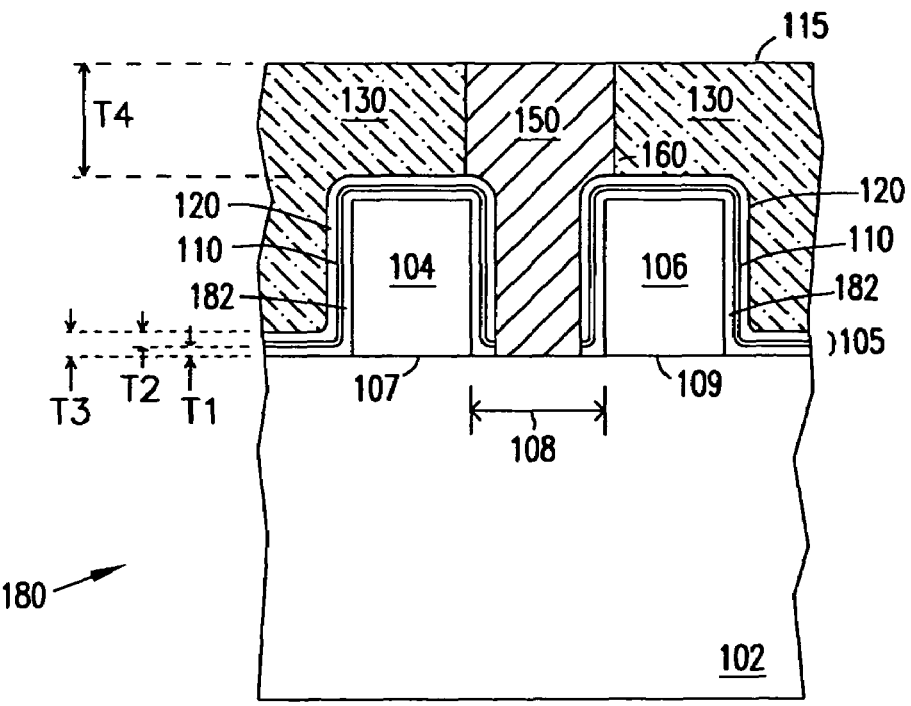
FIG. 1B is a cross-section of a semiconductor device according to another embodiment of the invention.

FIG. 1B is a cross-section of a semiconductor device according to another embodiment of the invention. Semiconductor device 180 includes elements similar to the elements of semiconductor device 100 (FIG. 1A). In FIG. 1B, diffusion barrier 105 further includes another insulating layer 182, in which alumina layer 120 is sandwiched between insulating layers 120 and 182.

Figure 2:
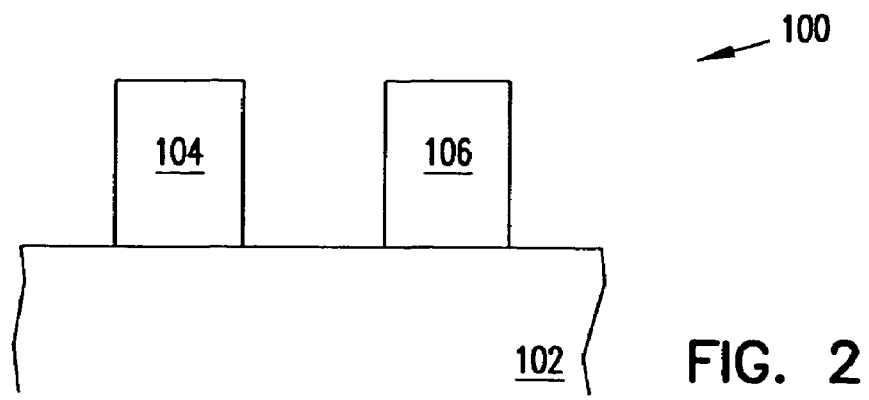
FIGS. 2-6 are cross-sections of the semiconductor device of FIG. 1A during various processing stages according to embodiments of the invention.

FIGS. 2-5 are cross-sections of the semiconductor device of FIG. 1A during various processing stages according to embodiments of the invention. In FIG. 2, surface structures 104 and 106 are formed on substrate 102 after some preliminary processes using known techniques. At this point structures (not shown) in the substrate are also formed. For examples, surface structures 104 and 106 of FIG. 2 can be gate structures of transistors and substrate at this point includes source and drain regions.

Figure 3:
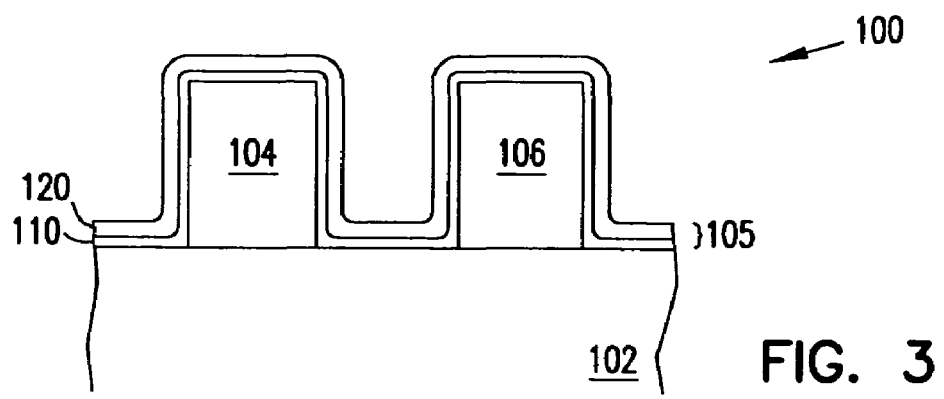

In FIG. 3, alumina layer 110 with a thickness in the range of about 20 to about 200 Angstroms is formed over surface structure 104 and 106 and substrate 102. An insulating layer 120 with a thickness in the range of about 20 to about 200 Angstroms is formed over alumina layer 110. Alumina layer 110 and insulating layer 120 form diffusion barrier 105. In embodiments represented by FIG. 3, insulating layer 120 is formed over alumina layer 110. In some embodiments, insulating layer 120 can be formed under alumina layer 110. In other embodiments, insulating layer 120 is omitted.

Figure 4:
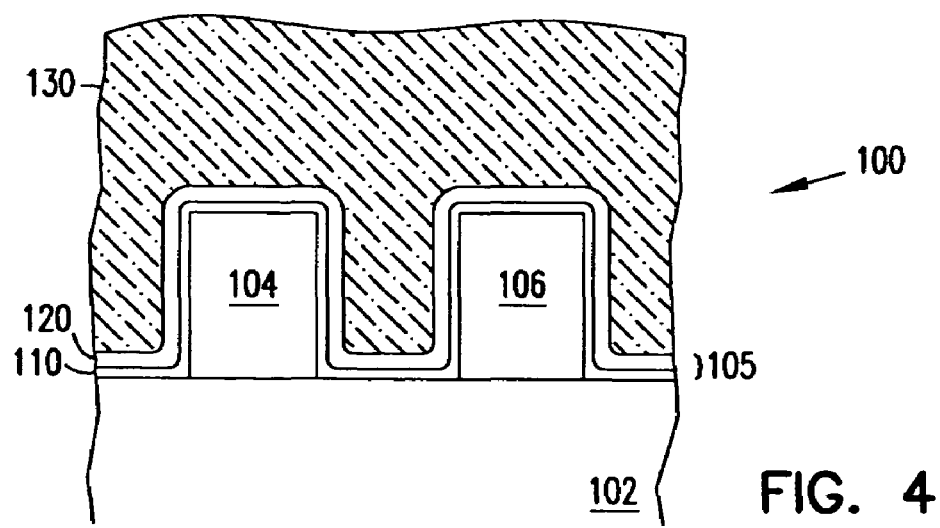

In FIG. 4, doped glass layer 130 is formed on insulating layer 120. Layers 110, 120, and 130 can be formed using a known technique such as plasma enhanced chemical vapor deposition (PECVD), atomic layer deposition, or furnace deposition.

Figure 5:
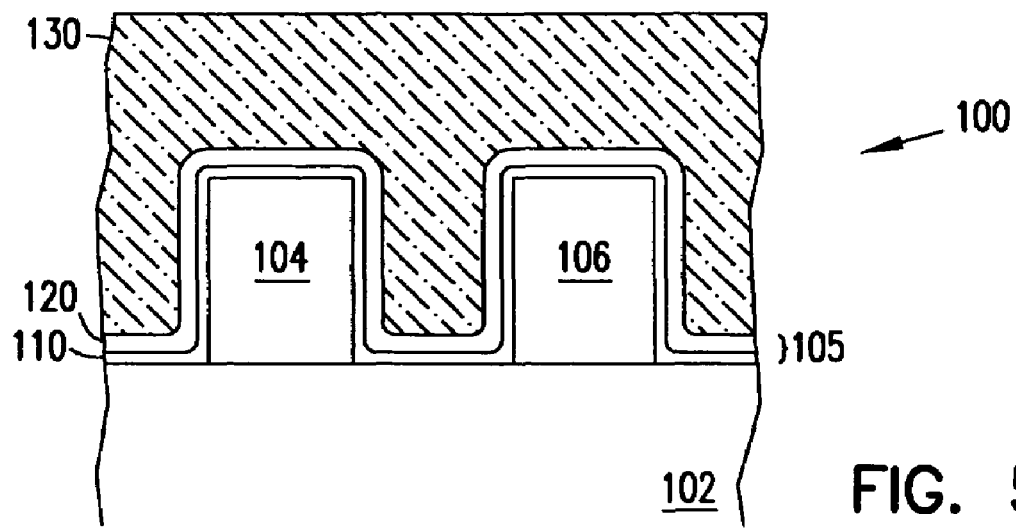

In FIG. 5, after a planarization process using a known technique is performed, the top surface of doped glass layer 130 is planarized, doped glass layer 130 has a final thickness T4 of about 3000 to about 12000 Angstroms. The planarization process can include an optional heat treatment step to reflow doped glass layer 130 to achieve a rough planarization. A final step of the planarization process can be done by a conventional chemical mechanical polishing (CMP) process.

Figure 6:
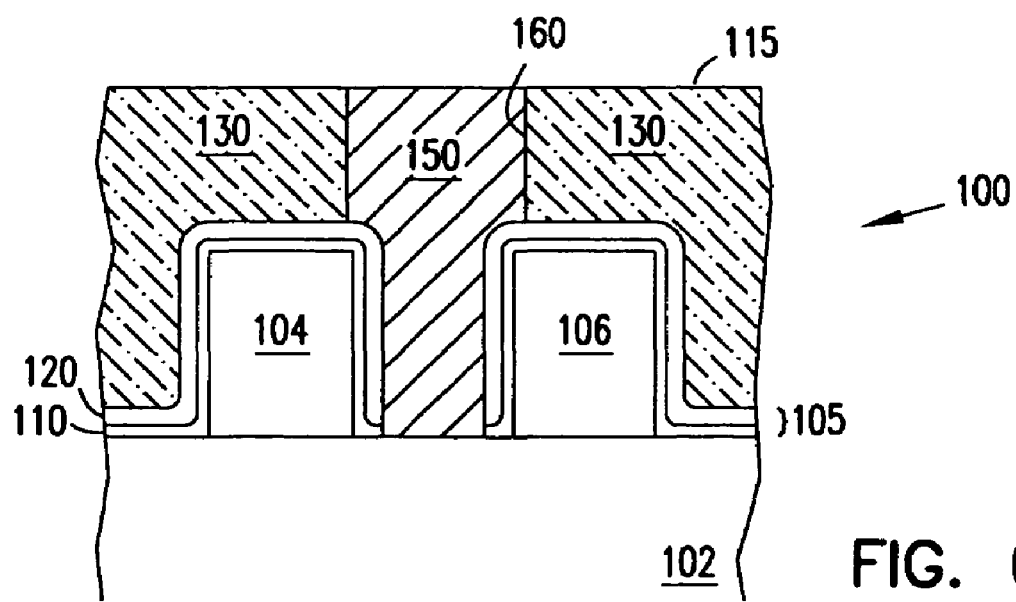

In FIG. 6, after the planarization process, a self aligned contact formation is performed using known etching techniques to form self aligned contacts 160. Contact structure 150 is subsequently formed in self aligned contacts 160 using a known technique. During an etching process to form self aligned contacts 160, since diffusion barrier 105 includes alumina layer 110, the etching process can be done selectively to both insulating layer 120 and alumina layer 110 with a final controlled punch etch. This increases the margin for uniformity of the main etching process. Other processes such as metal contact formation (not shown) can be done to complete device 100.

Figure 7A:
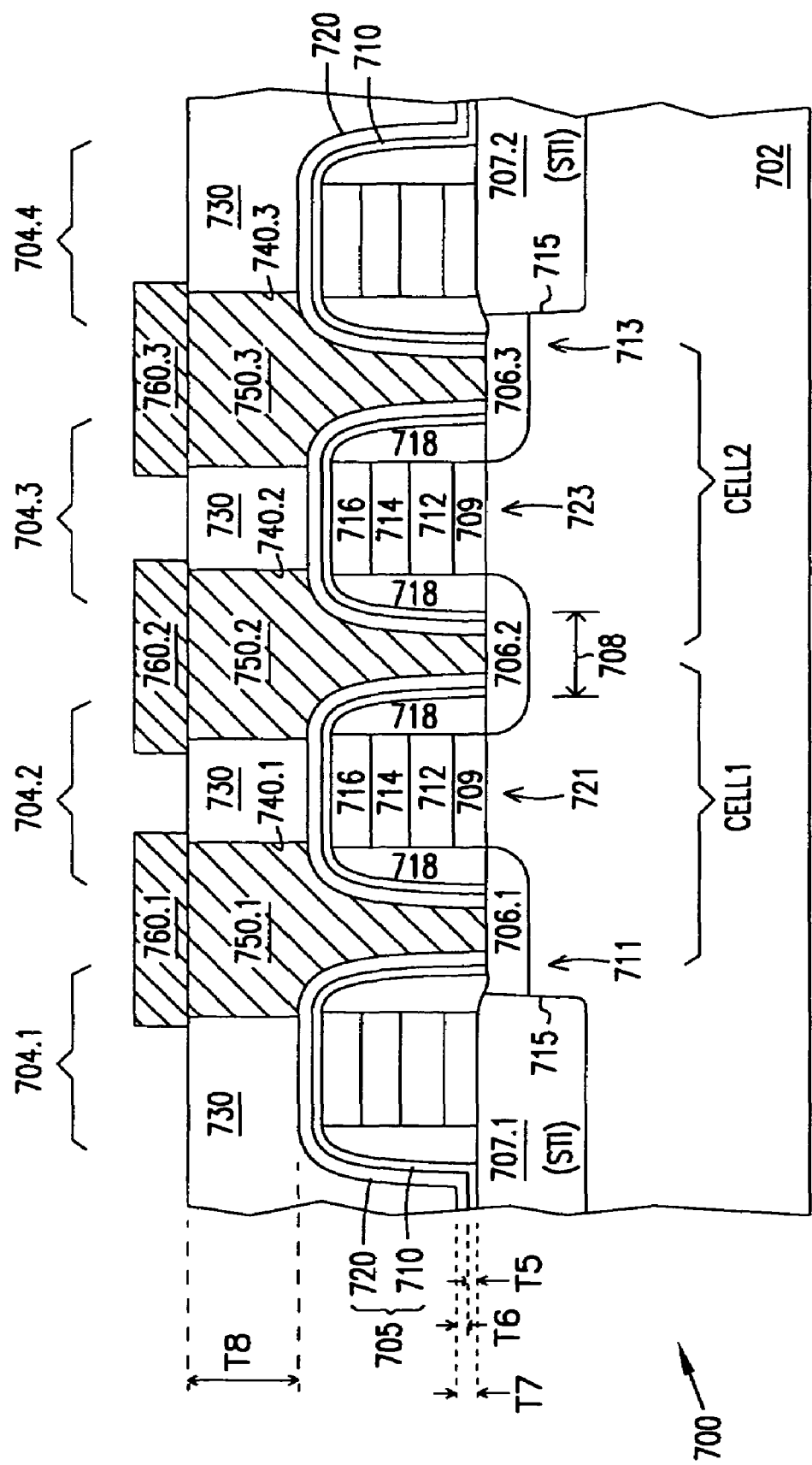
FIG. 7A is a cross-section of a portion of a memory device according to an embodiment of the invention.

FIG. 7A is a cross-section of a portion of a memory device according to an embodiment of the invention. Memory device 700 includes a substrate 702, and many gate structures 704.1 through 704.4 formed over substrate 702. A number of diffusion regions 706.1 through 706.3 are formed in substrate 702. A number of isolation structures 707.1 and 707.2 are formed near diffusion region 706.1 at region 711, and near diffusion region 706.3 at region 713. Isolation structures 707.1 and 707.2 have side walls 715. In some embodiments, isolation structures 707.1 and 707.2 are shallow trench isolation (STI) structures. Gate structure 704.2 is formed above a channel region 721 between diffusion regions 706.1 and 706.2. Gate structure 704.3 is formed above a channel region 723 between diffusion regions 706.2 and 706.3.

Gate structures 704.2-704.3 and diffusion regions 706.1-706.3 form a number of memory cells such as CELL1 and CELL2. Each memory cell includes an access transistor and a storage capacitor. For example, in memory cell CELL1, gate structure 704.2 and diffusion regions 706.1 and 706.2. form an access transistor. Diffusion region 706.1, shared by the access transistor, forms one plate (storage node) of the storage capacitor. For simplicity, FIG. 7A omits the other plate (cell plate or plate electrode) of the storage capacitor and other structures of memory device 700.

In embodiments represented by FIG. 7, substrate 702 includes silicon doped with a dopant, for example boron, to make it a P-type material. Diffusion regions 706.1-706.3 are doped with a dopant, for example phosphorous, to make them an N-type material. In some embodiments, substrate 702 can be an N-type material and diffusion regions 706.1-706.3 can be P-type material.

The N-type material has excess electrons as majority carriers for conducting current. The P-type material has excess holes as majority carriers for conducting current. In the description, the term "diffusion region" refers to a region having a semiconductor material doped with a dopant to become either an N-type material or a P-type material.

Each of the gate structures 704.1-704-4 includes a gate dielectric (gate oxide) 709 formed on substrate 702, a doped polysilicon layer 712, a suicide layer 714, a capping dielectric layer 716, and dielectric spacers 718. Silicide layer 714 can include a compound of metal and silicon such as titanium silicide, tungsten silicide, and others. All the dielectrics can include material such as silicon oxide. Each of the gate structures 704.1-704.3 is also referred to as a word line. Between two adjacent gate structures is a gap 708.

Memory device 700 also includes a diffusion barrier 705 and a doped glass layer 730, all formed over gate structures 704.1-704.4 and substrate 702. Diffusion barrier 705 includes an alumina layer 710 and an insulating layer 720. Insulating layer 720 can include silicon nitride ($Si_2N_3$), silicon dioxide ($SiO_2$), or other insulating materials. Alumina layer 710 has a thickness T5. In some embodiments, T5 is in the range of about 20 to about 200 Angstroms. Insulating layer 720 has a thickness T6. In some embodiments, T6 is in the range of about 20 to about 200 Angstroms. In other embodiments, diffusion barrier 705 has a thickness T7 in the range of about 20 Angstroms to about 400 Angstroms. Doped glass layer 730 can be a silicate glass doped with one or more dopants such as boron and phosphorous, or other type of doped glass. For example, doped glass layer 730 can be Boronsilicate glass (BSG), or Phosphosilicate glass (PSG). In FIG. 7, doped glass layer 730 includes Borophosphosilicate glass (BPSG) and has a thickness T8. In some embodiments, T8 is about 3000 Angstroms. In other embodiments, T8 is in the range of 2000 to 5000 Angstroms.

In embodiments represented by FIG. 7A, insulating layer 720 is formed over alumina layer 710. In some embodiments, insulating layer 120 can be formed under alumina layer 710. In other embodiments, insulating layer 720 is omitted.

Memory device 700 further includes a number of self aligned contacts 740.1 through 740.3 extending through doped glass layer 730 and diffusion barrier 705. Contact structures 750.1 through 750.3 are formed in self aligned contacts 740.1-740.3 to provide electrical connections to diffusion regions 706.1-706.3. Metal line structures 760.1 through 760.3 are formed over doped glass layer 730 and are connected to respective contact structures 750.1-750.3. In some embodiments, metal line structure 760.1 is a bit line of memory device 700, and metal line structures 760.2 and 760.3 connect to a common cell plate of the capacitors of memory device 700. FIG. 7A omits the cell plate or clarity.

Alumina layer 710 provides advantages similar to that of alumina layer 110 described in FIG. 1. For example, alumina layer 710 allows more width (opening) left in gap 708 after the formation of diffusion barrier 705, provides a barrier and a source for hydrogen at the interface between gate dielectric 709 and substrate 702, and other advantages which will become apparent in the subsequent description.

Figure 7B:
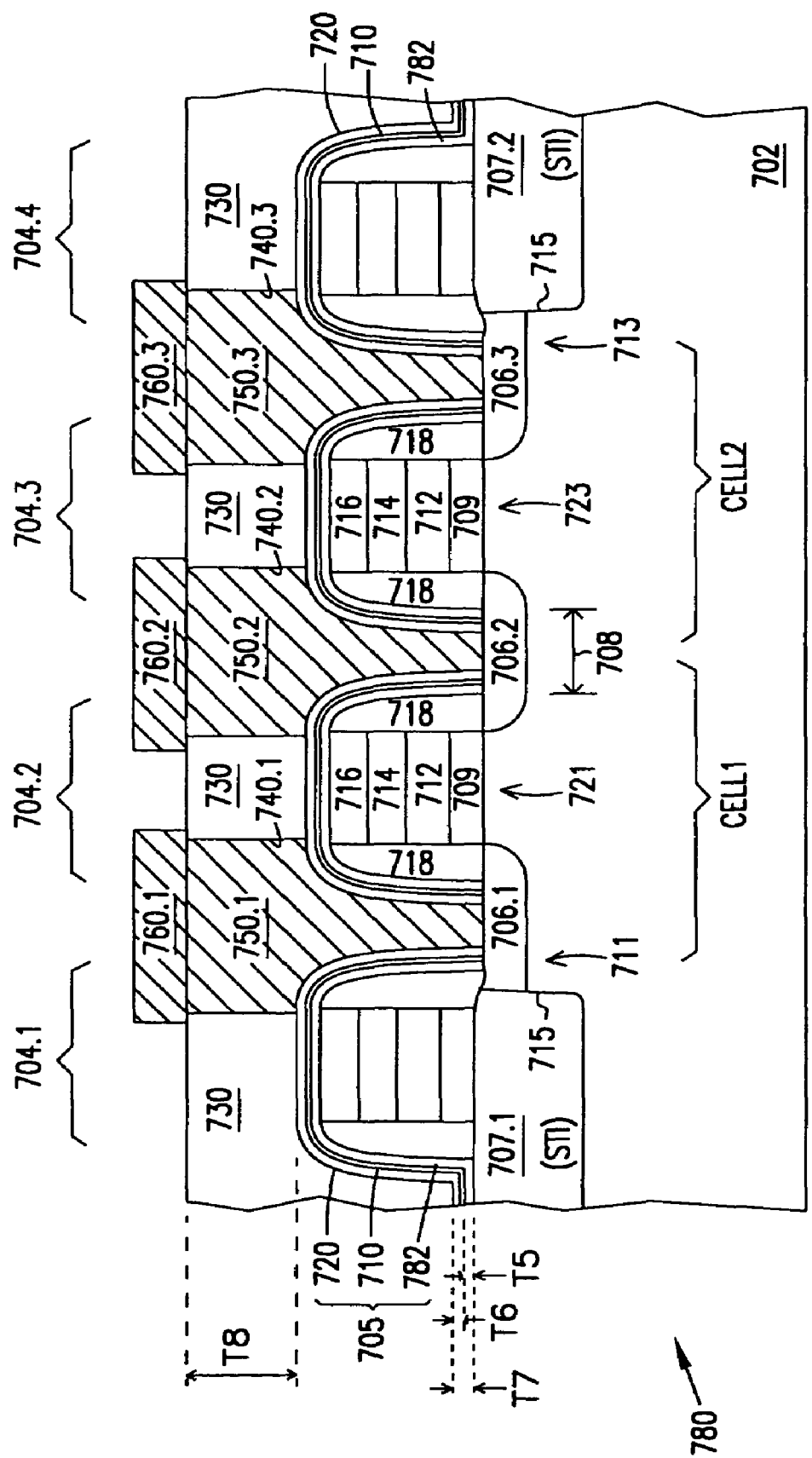
FIG. 7B is a cross-section of a portion of a memory device according to another embodiment of the invention.

FIG. 7B is a cross-section of a portion of a memory device according to another embodiment of the invention. Memory device 780 includes elements similar to the elements of memory device 700 (FIG. 7A). In FIG. 7B, diffusion barrier 705 further includes another insulating layer 782, in which alumina layer 720 is sandwiched between insulating layers 720 and 782.

Figure 8:
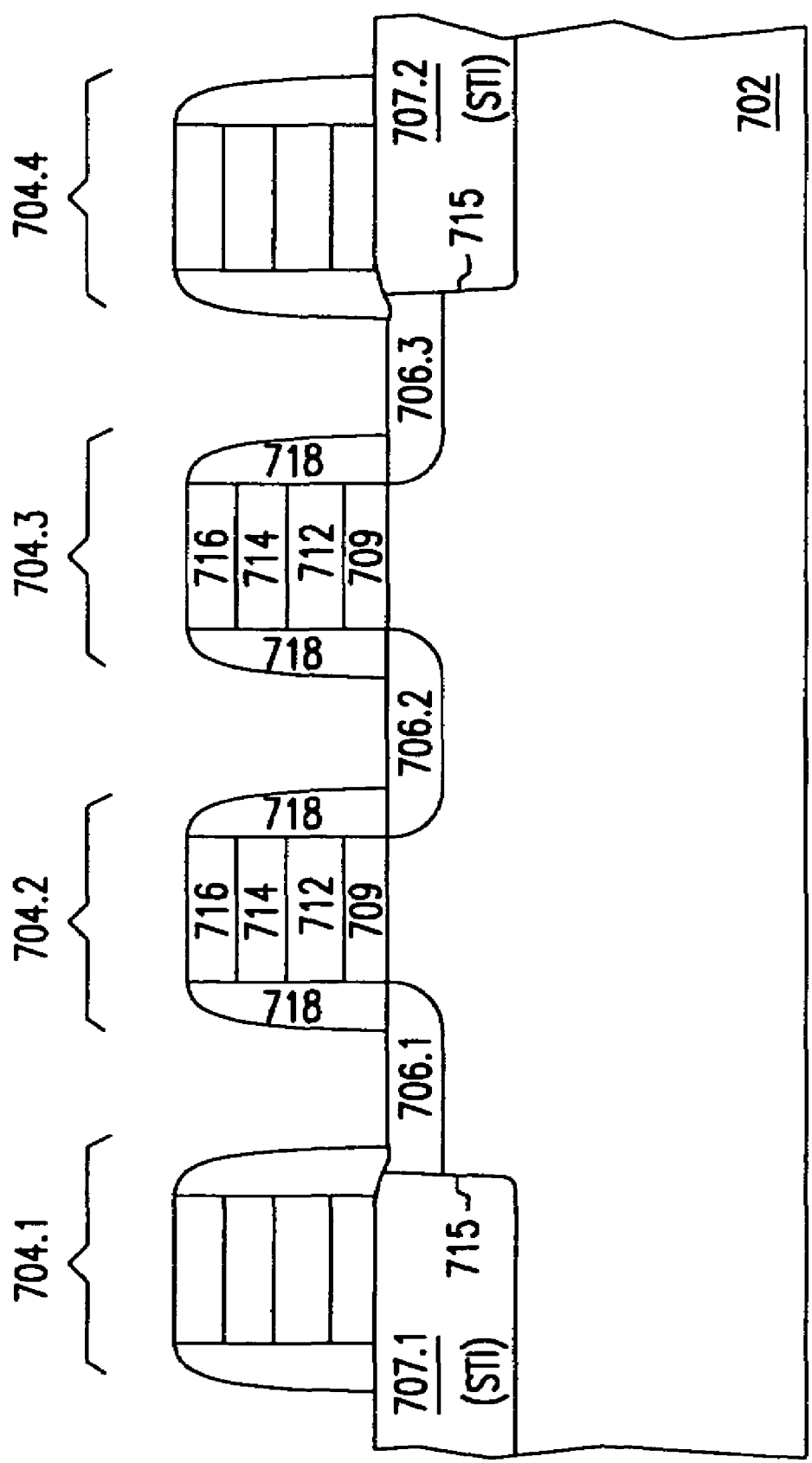
FIGS. 8-15 are cross-sections of the portion of the memory device of FIG. 7A during various processing stages according to embodiments of the invention.

FIGS. 8-14 are cross-sections of the portion of the memory device of FIG. 7A during various processing stages according to embodiments of the invention. In FIG. 8, gate structures 704.1-704.4, diffusion regions 706.1-706.3, and isolation structures 707.1 and 707.2 are formed on substrate 702 after some initial processes using known techniques.

Figure 9:
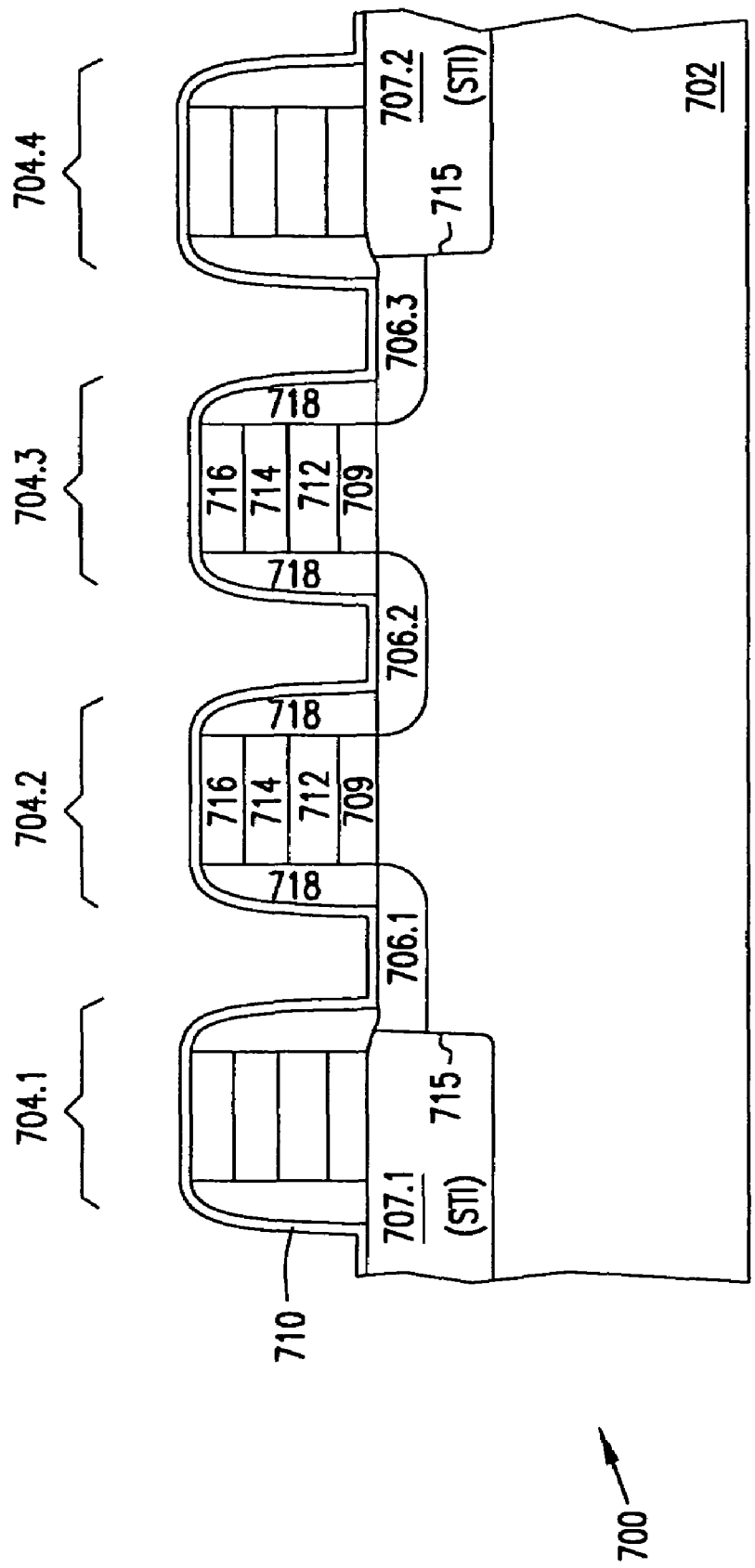

In FIG. 9, a blanket alumina layer 710 with a thickness in the range of about 20 to about 200 Angstroms is formed over gate structures 704.1-704.4 and substrate 702 using a known technique such as plasma enhanced chemical vapor deposition (PECVD), atomic layer deposition, or furnace deposition. In some embodiments, heavy water $D_2O$ (deuterium oxide) is used during the formation of alumina layer 710.

Figure 10:
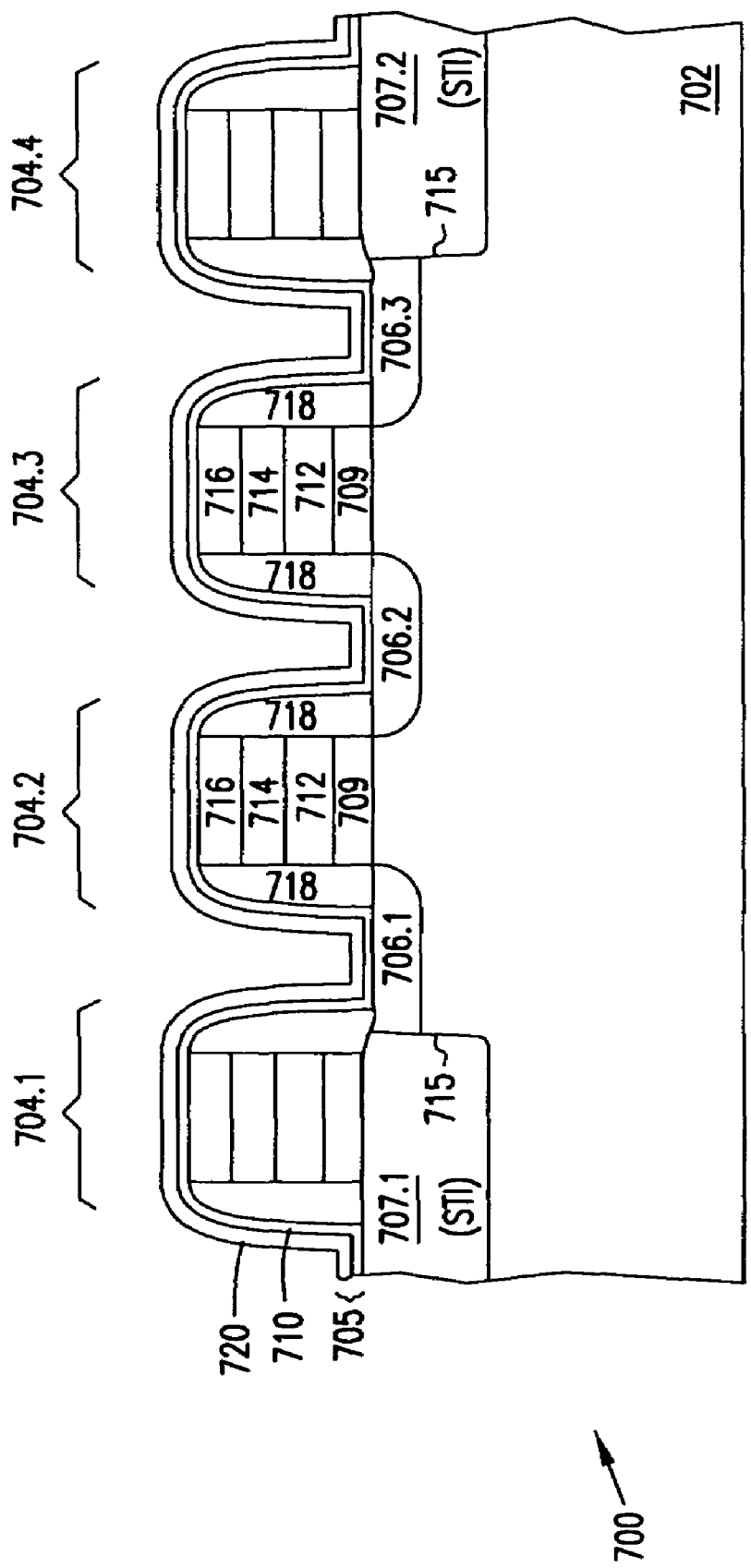

In FIG. 10, insulating layer 720 with a thickness in the range of about 20 to about 200 Angstroms is formed on alumina layer 710 using a known technique. Alumina layer 710 and insulating layer 720 form diffusion barrier 705. In embodiments represented by FIG. 10, insulating layer 720 is formed over alumina layer 710. In some embodiments, insulating layer 720 can be formed under alumina layer 710. In other embodiments, insulating layer 720 is omitted.

In some embodiments, the total thickness of alumina layer 710 and insulating layer 720 is about 20 Angstroms to about 400 Angstroms. In other embodiments, the total thickness of alumina layer 710 and insulating layer 720 is less than 250 Angstroms. Some conventional diffusion barriers have a thickness of about 250 Angstroms. Thus, in embodiments, the total thickness of less than 250 Angstroms (instead of 250 Angstroms) allows more opening (width) left in gap 708 after the formation of alumina layer 710 and insulating layer 720. This enhances subsequent contact structure formation in gap 708 for purposes such as self aligned contact formation.

Figure 11:
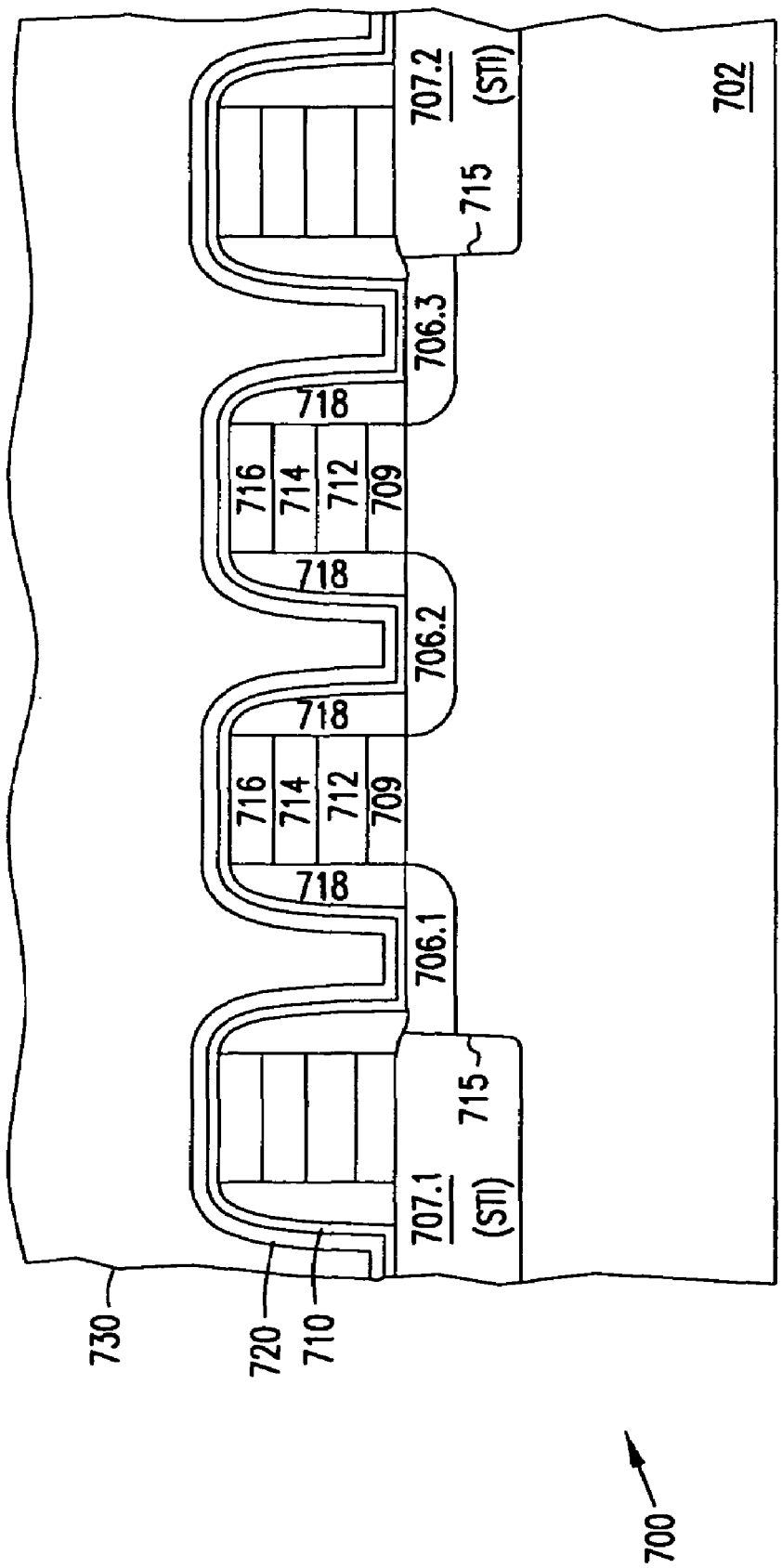

In FIG. 11, doped glass layer 730 is formed on insulating layer 720 using a known technique.

Figure 12:
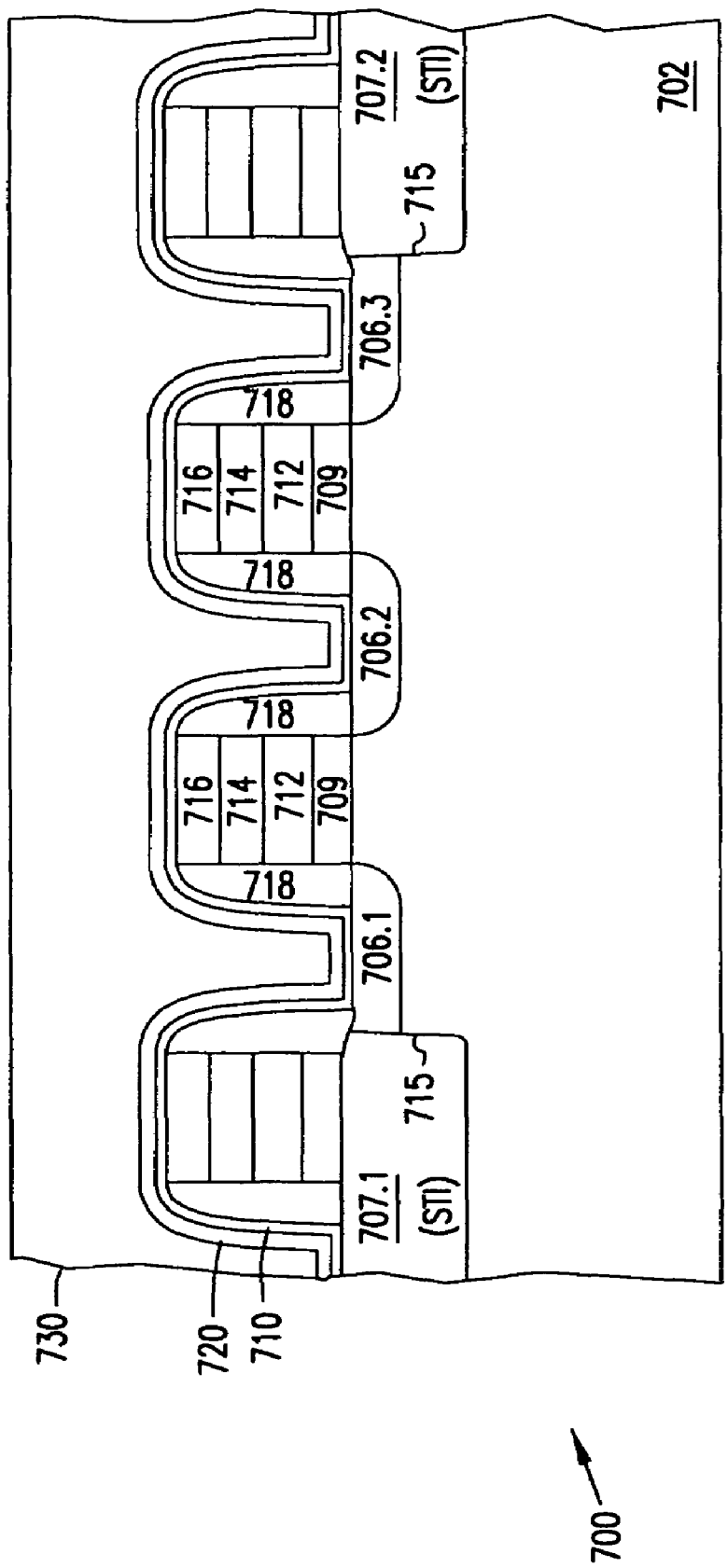

In FIG. 12, after a planarization process is performed using a known technique, the top surface of doped glass layer 730 is planarized, doped glass layer 730 has a final thickness of about 2000 to about 5000. The planarization process can include an optional heat treatment step to reflow doped glass layer 730 to achieve a rough planarization. A final step of the planarization process can be done by a conventional chemical mechanical polishing (CMP) process.

Figure 13:
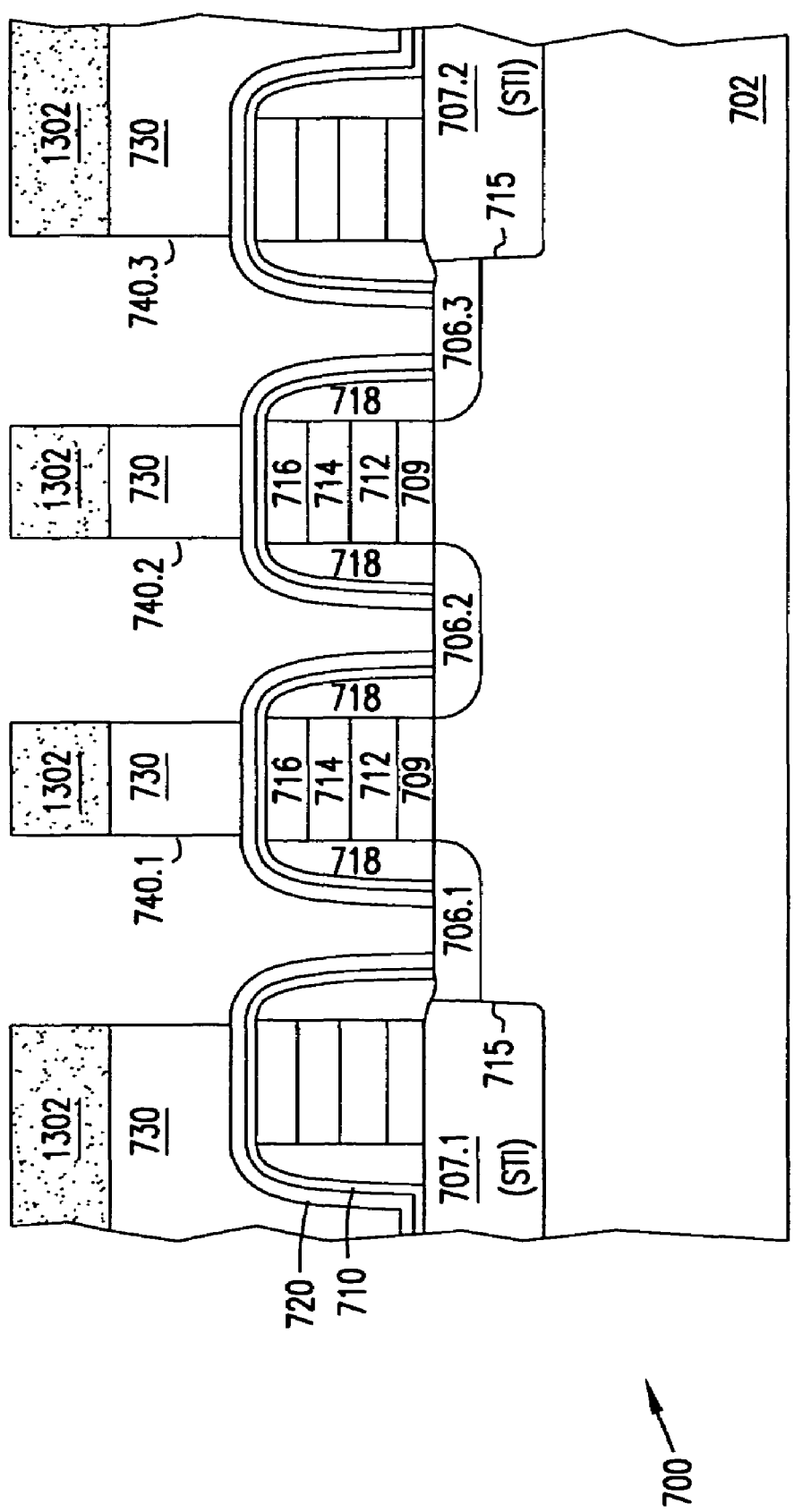

In FIG. 13, after the planarization process, self aligned contact formation using a known technique is performed to form self aligned contacts 740.1-740.3. The self aligned contact formation begins with deposition of masking material 1302. Subsequent etching forms self aligned contacts 740.1-740.3 extending through doped glass layer 730 and diffusion barrier 705 to diffusion regions 706.1-706.3.

Since diffusion barrier 705 includes alumina layer 710, the etching process can be done selectively to both insulating layer 720 and alumina layer 710 with a final controlled punch etch. This increases the uniformity of the main etching process. Further, in some embodiments, some portions of isolation structures 707.1 and 707.2 at side walls 715 in regions 711 and 713 may overlap the openings of self aligned contacts 740.1 and 740.3. In these embodiments, the etching process may expose side walls 715, leading to a parasitic diode in regions 711 and 713. This increases the leakage of the adjacent storage nodes (diffusion regions 706.1 and 706.3) in regions 711 and 713, thereby reducing the retention time of the memory cells. With alumina layer 710 being used as a diffusion barrier, selective etching can be done to the alumina layer to reduce the exposure of the side walls 715 of isolation structures 707.1 and 707.2, thereby decreasing the leakage to maintain the retention time.

In addition, the presence of deuterium in alumina layer 710 may passivate defects in gate dielectrics 709 and STI structures 707.1 and 707.2. The presence of deuterium in alumina layer 710 may also allow formation of silicon-deuterium type of bonds, leading to better retention time.

Figure 14:
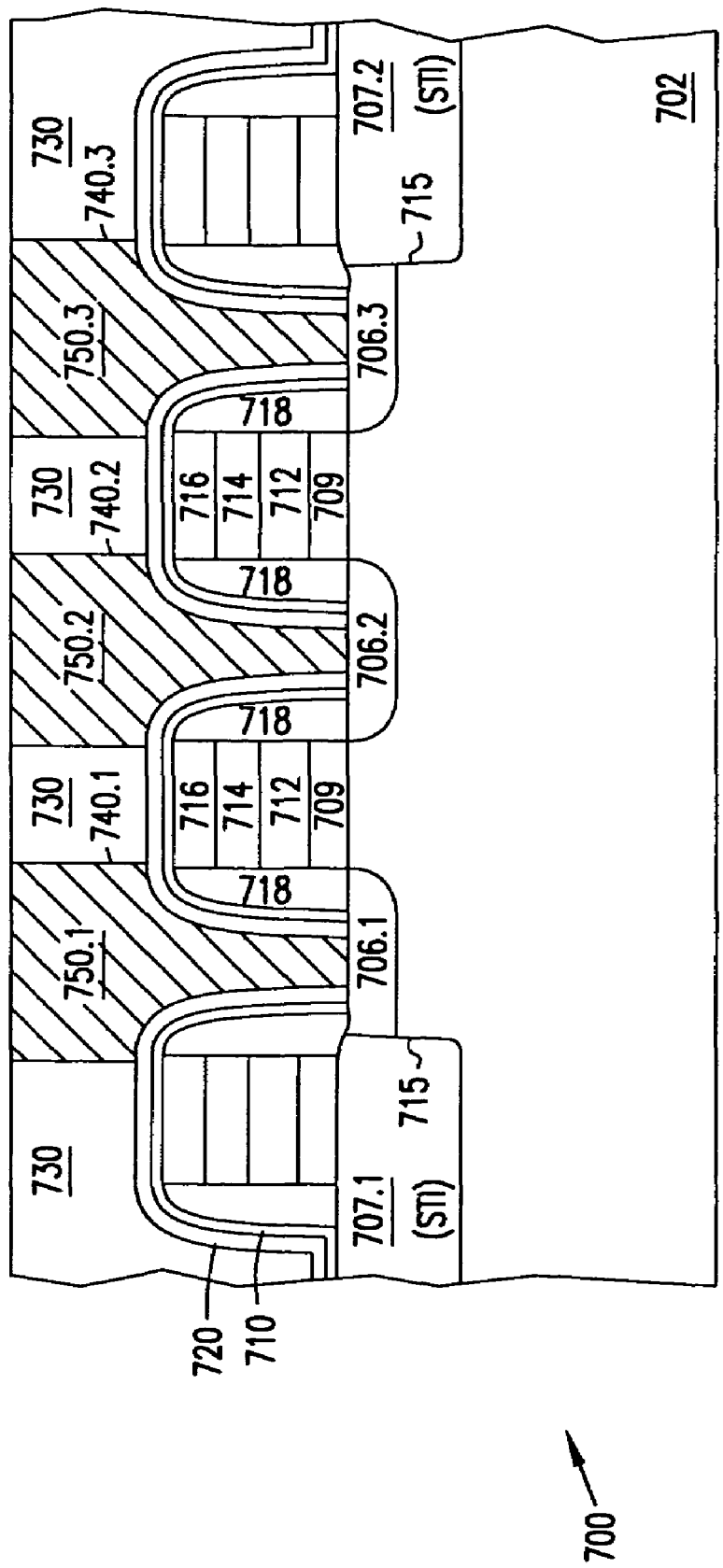
Figure 15:
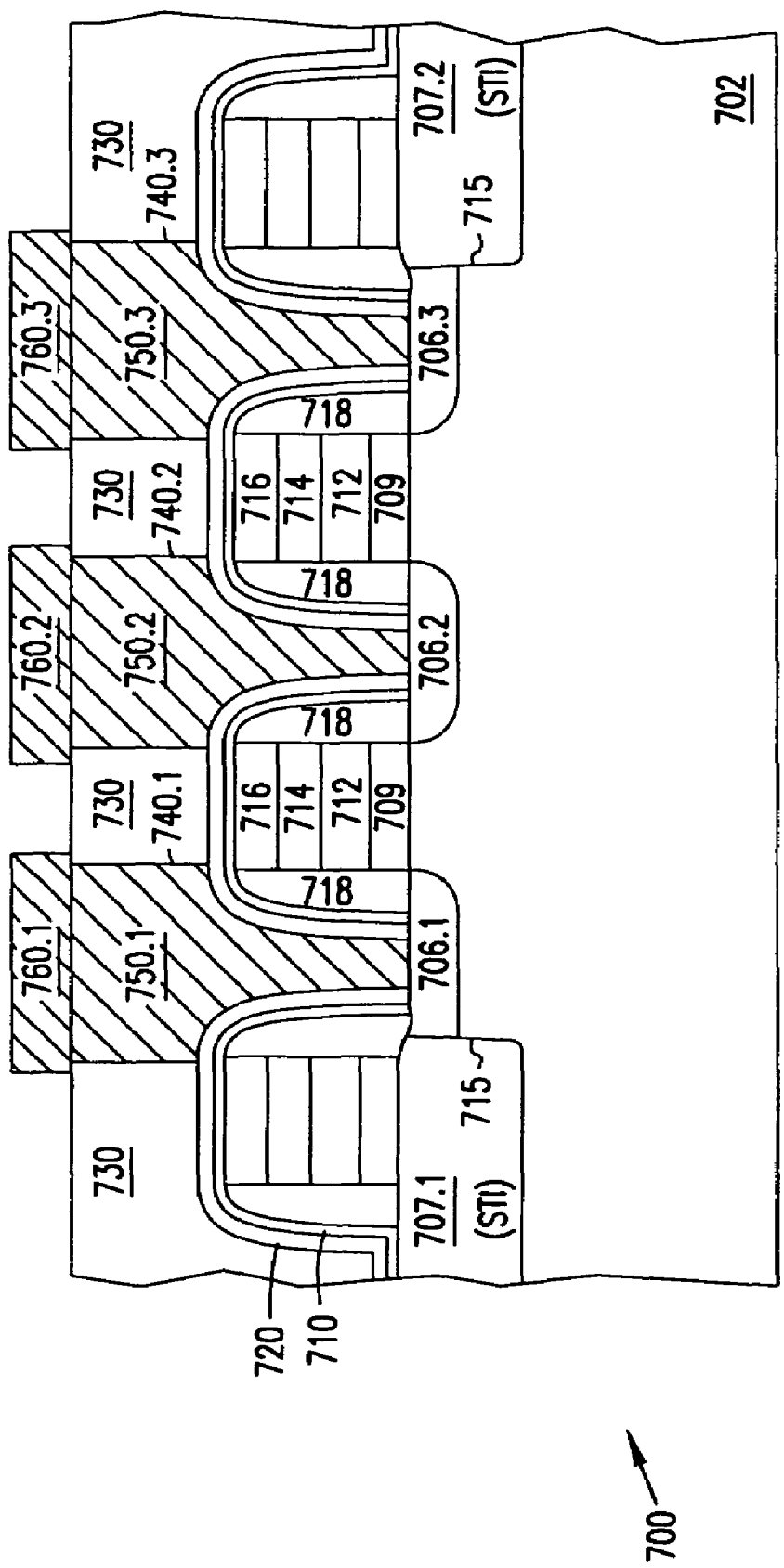

In FIG. 14, contact structures 750.1-750.3 are formed in self aligned contacts 740.1-740.3 using a known technique. In FIG. 15, metal line structures 760.1-760.3 are formed over doped glass layer 730 and are respectively connected to contact structures 750.1-750.3 to provide electrical connections to the underlying structures.

Figure 16:
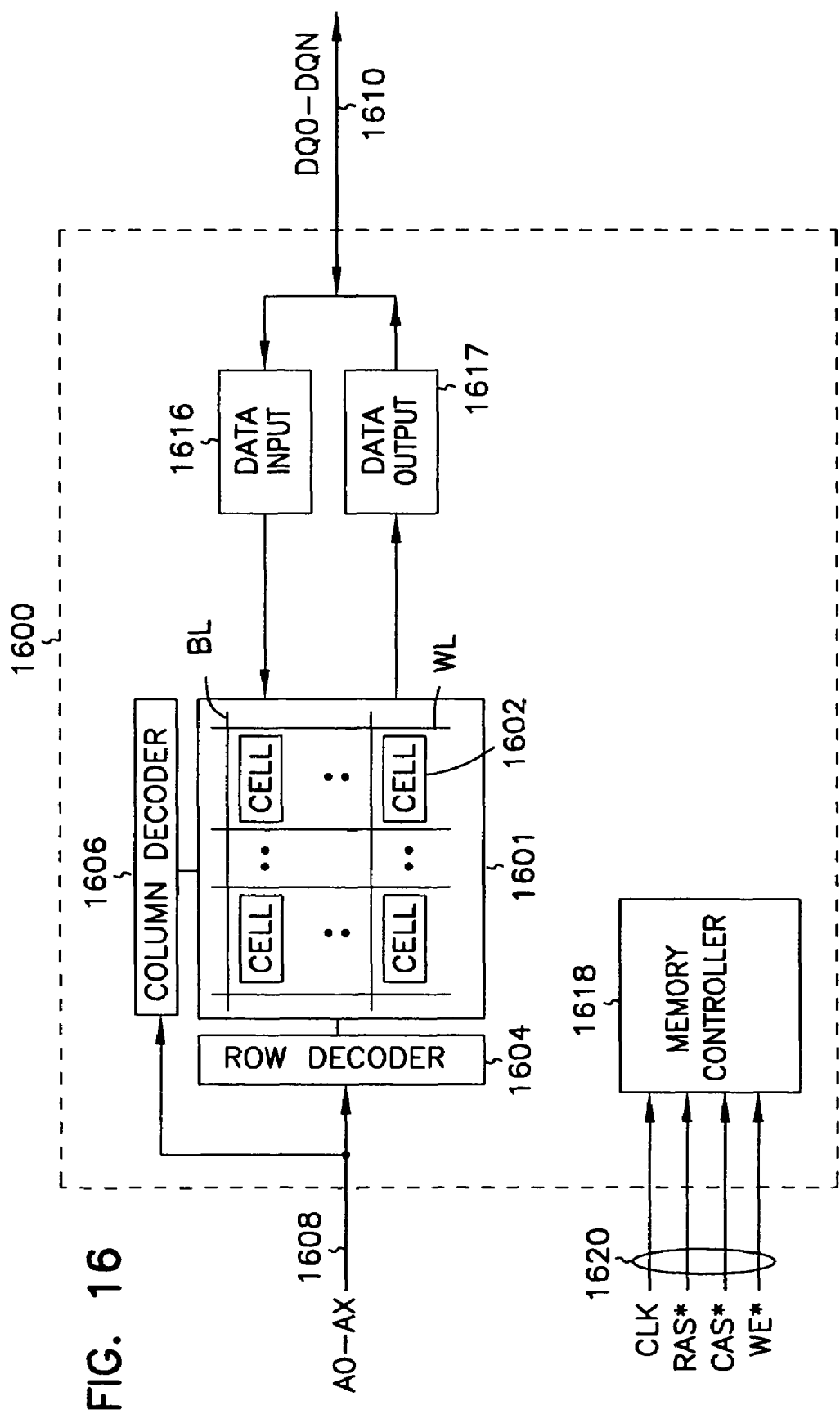
FIG. 16 shows a memory device according to an embodiment of the invention.

FIG. 16 shows a memory device according to an embodiment of the invention. Memory device 1600 includes a memory array 1601 having plurality of memory cells 1602 arranged in rows and columns along with word lines WL and bit lines BL. Row and column decoders 1604 and 1606 provide access to memory cells 1602 in response to address signals A0-AX on address lines (or address bus) 1608. A data input circuit 1616 and data output circuit 1617 transfer data between memory cells 1602 and data lines (or data bus) 1610. Data lines 1610 carry data signals DQ0-DQN. A memory controller 1618 controls the operations of memory device 1600 based on control signals on control input lines 1620. Examples of control signals include a clock signal CLK, a row access strobe signal RAS*, a column access strobe CAS* signal, and a write enable signal WE*. Memory device 1600 is an integrated circuit and includes other circuit elements. For simplicity, the other circuit element are omitted from FIG. 16.

Memory device 1600 includes embodiments of device 100 (FIG. 1) and device 700 (FIG. 7). Thus, memory device 1600 has diffusion barriers such as diffusion barriers 105 and 705 with alumina layers 110 and 710 formed under doped glass layers such as doped glass layers 130 and 730.

Figure 17:
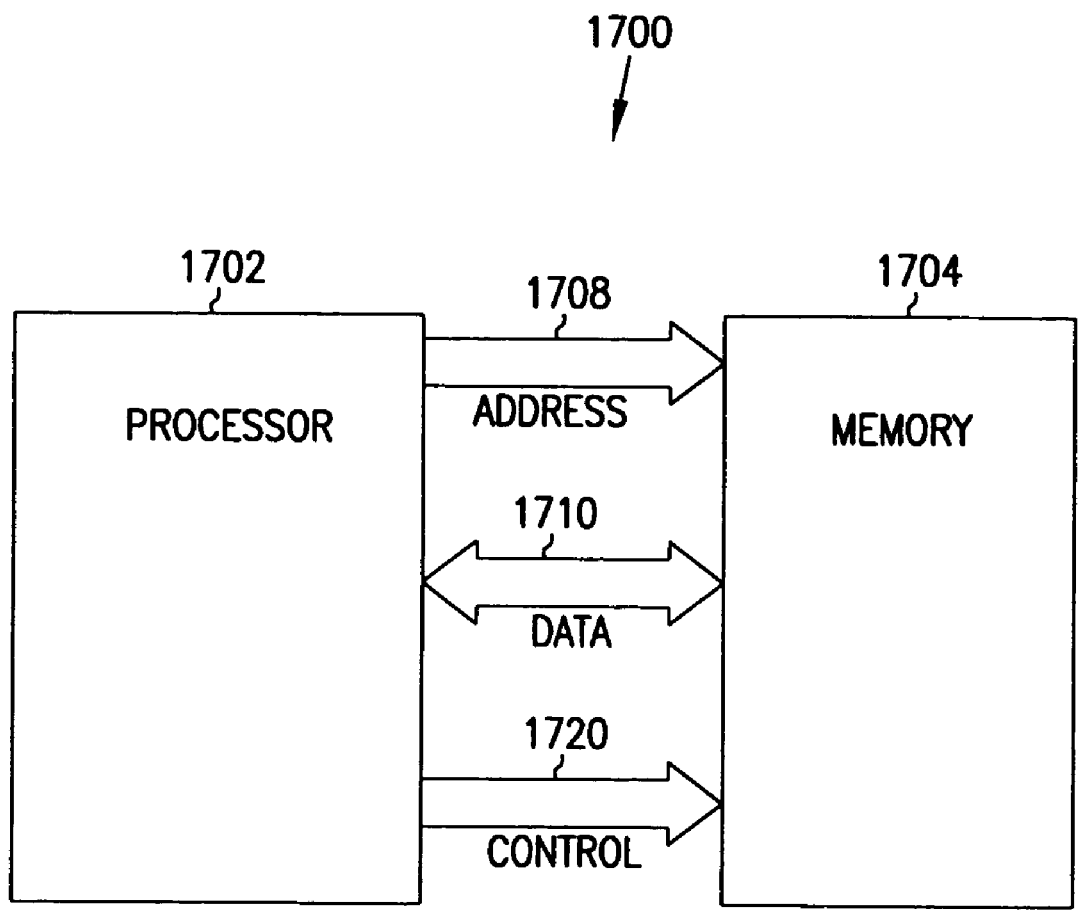
FIG. 17 shows a system according to an embodiment of the invention.

FIG. 17 shows a system according to an embodiment of the invention. System 1700 includes a first integrated circuit (IC) 1702 and a second IC 1704. ICs 1702 and 1704 can include processors, controllers, memory devices, application specific integrated circuits, and other types of integrated circuits. In embodiments represented by FIG. 17, for example, IC 1702 represents a processor, and IC 1702 represents a memory device. Processor 1702 and memory device 1704 communicate using address signals on lines 1708, data signals on lines 1710, and control signals on lines 1720.

Memory device 1704 can be memory device 1600 of FIG. 16. Thus, memory device 1704 has diffusion barriers such as diffusion barriers 105 and 705 with alumina layers 110 and 710 formed under doped glass layers such as doped glass layers 130 and 730.

System 1700 represented by FIG. 17 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provides structures and methods for an improved dopant barrier for doped glass. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A semiconductor device comprising:
   a substrate;
   a plurality of diffusion regions formed in the substrate, the plurality of diffusion regions includes a first diffusion region, a second diffusion region, and a third diffusion region;
   a plurality of gate structures formed over the substrate, the plurality of gate structures includes a first gate structure formed over a channel region between the first and second diffusion regions, and a second gate structure formed over a channel region between the second and third diffusion regions, wherein the first gate structure and the first and second diffusion regions form at least a portion of a first memory cell with the first diffusion region formed at least a portion of a storage node of the first memory cell, and wherein the second gate structure and the second and third diffusion regions form at least a portion of a second memory cell;
   a diffusion barrier including an alumina layer formed on the gate structures, wherein the alumina layer remains in the semiconductor device after the semiconductor device is formed, wherein a first portion of the alumina layer completely covers a top surface of the first gate structure and completely covers a top surface of the second gate structure, wherein a second portion of the alumina layer is below the top surface of at least one of the first and second gate structures, wherein the diffusion barrier layer includes a first insulating layer and a second insulating layer, wherein the alumina layer is between the first and second insulating layers, wherein each of the first and second insulating layers includes a first portion above the top surface of each of the first and second gate structures, and wherein each of the first and second insulating layers includes a second portion below the top surface of at least one of the first and second gate structures; and
   a doped glass layer formed on the diffusion barrier.

2. The semiconductor device of claim 1, wherein the alumina layer has a thickness in a range of about 20 Angstroms to about 200 Angstroms.

3. The semiconductor device of claim 1, wherein the diffusion barrier further includes deuterium.

4. The semiconductor device of claim 3, wherein the deuterium is provided by using heavy water during a formation of the diffusion barrier.

5. The semiconductor device of claim 1, wherein the first insulating layer includes material selected from the group consisting of silicon nitride and silicon dioxide.

6. The semiconductor device of claim 1, wherein the first insulating layer has a thickness in a range of about 20 Angstroms to about 200 Angstroms.

7. The semiconductor device of claim 1, wherein the first insulating layer and the alumina layer have a total thickness in a range of about 20 Angstroms to about 400 Angstroms.

8. The semiconductor device of claim 1, wherein the doped glass layer includes Borophosphosilicate glass (BPSG).

9. The semiconductor device of claim 1, wherein the doped glass layer has a thickness of about 3000 Angstroms.

10. The semiconductor device of claim 1, wherein the doped glass layer has a thickness in a range of 2000 to 5000 Angstroms.

11. A semiconductor device comprising:
a substrate;
a plurality of diffusion regions formed in the substrate, the plurality of diffusion regions includes a first diffusion region, a second diffusion region, and a third diffusion region;
a plurality of gate structures formed over the substrate, the plurality of gate structures includes a first gate structure formed over a channel region between the first and second diffusion regions, and a second gate structure formed over a channel region between the second and third diffusion regions, wherein the first gate structure and the first and second diffusion regions form at least a portion of a first memory cell with the first diffusion region formed at least a portion of a storage node of the first memory cell, and wherein the second gate structure and the second and third diffusion regions form at least a portion of a second memory cell with the third diffusion region formed at least a portion of a storage node of the second memory cell;
a diffusion barrier including an alumina layer formed on the gate structures, wherein the alumina layer remains in the semiconductor device after the semiconductor device is formed, wherein the alumina layer conforms to the gate structures and the substrate, wherein the alumina layer completely covers a top surface of the first gate structure and completely covers a top surface of the second gate structure, wherein the diffusion barrier layer includes a first insulating layer and a second insulating layer, wherein the alumina layer is between the first and second insulating layers, wherein each of the first and second insulating layers includes a first portion above the top surface of each of the first and second gate structures, and wherein each of the first and second insulating layers includes a second portion below the top surface of at least one of the first and second gate structures; and
a doped glass layer formed on the diffusion barrier.

12. A semiconductor device comprising:
a first diffusion region formed in a substrate;
a second diffusion region formed in the substrate, the first and second diffusion regions being separated by a first channel region of the substrate;
a first gate structure formed over the first channel region;
a third diffusion region formed in the substrate, the third and second diffusion regions being separated by a second channel region of the substrate;
a second gate structure formed over the second channel region, wherein the first gate structure and the first and second diffusion regions form at least a portion of a first memory cell with the first diffusion region formed at least a portion of a storage node of the first memory cell, and wherein the second gate structure and the second and third diffusion regions form at least a portion of a second memory cell with the third diffusion region formed at least a portion of a storage node of the second memory cell;
an alumina layer formed over the first and second gate structures, wherein the alumina layer remains in the semiconductor device after the semiconductor device is formed, wherein a first potion of the alumina layer completely covers a top surface of the first gate structure and completely covers a top surface of the second gate structure, wherein a second portion of the alumina layer directly contacts at least one of the first and second gate structures; and
a first insulating layer and a second insulating layer sandwiching the alumina layer, wherein each of the first and second insulating layers includes a first portion above the top surface of each of the first and second gate structures, and wherein each of the first and second insulating layers includes a second portion below the top surface of at least one of the first and second gate structures.

13. The semiconductor device of claim 12, wherein the alumina layer has a thickness, wherein the thickness has a range including a first range limit and a second range limit greater than the first range limit, and wherein the first range limit is about 20 Angstroms.

14. A semiconductor device comprising:
a first diffusion region formed in a substrate;
a second diffusion region formed in the substrate, the first and second diffusion regions being separated by a first channel region of the substrate;
a first gate structure formed over the first channel region;
a third diffusion region formed in the substrate, the third and second diffusion regions being separated by a second channel region of the substrate;
a second gate structure formed over the second channel region, wherein the first gate structure and the first and second diffusion regions form at least a portion of a first memory cell with the first diffusion region formed at least a portion of a storage node of the first memory cell, and wherein the second gate structure and the second and third diffusion regions form at least a portion of a second memory cell;
an alumina layer formed over the first and second gate structures, wherein the alumina layer remains in the semiconductor device after the semiconductor device is formed, and wherein the alumina layer completely covers a top surface of the first gate structure and completely covers a top surface of the second gate structure, wherein the first gate structure includes a first side surface and a second side surface, and wherein the alumina layer conforms to the first and second side surfaces of the first gate structure; and
a first insulating layer and a second insulating layer sandwiching the alumina layer, wherein each of the first and second insulating layers includes a first portion above the top surface of each of the first and second gate structures, and wherein each of the first and second insulating layers includes a second portion below the top surface of at least one the first and second gate structures.

15. A semiconductor device comprising:
a substrate;
a first diffusion region formed in the substrate;
a second diffusion region formed in the substrate, wherein the first and second diffusion regions are separated by a first channel region;
a first gate dielectric layer formed over the first channel region;

a first conductive layer formed over the first gate dielectric layer;

a third diffusion region formed in the substrate, wherein the third and second diffusion regions are separated by a second channel region;

a second gate dielectric layer formed over the second channel region;

a second conductive layer formed over the second gate dielectric layer;

an alumina layer formed over the first and second conductive layers, wherein the alumina layer remains in the semiconductor device after the semiconductor device is formed, wherein a first portion of the alumina layer completely covers a top surface of the first conductive layer and completely covers a top surface of the second conductive layer, and wherein a second portion of the alumina layer is below the top surface of at least one of the first and second conductive layers;

a first insulating layer and a second insulating layer sandwiching the alumina layer, wherein each of the first and second insulating layers includes a first portion above the top surface of each of the first and second conductive layers, and wherein each of the first and second insulating layers includes a second portion below the top surface of at least one of the first and second conductive layers; and a first conductive contact structure coupled to the first diffusion region to provide electrical connection to the first diffusion region.

16. The semiconductor device of claim 15, wherein the alumina layer has a thickness, wherein the thickness has a range including a first range limit and a second range limit greater than the first range limit, and wherein the first range limit is about 20 Angstroms.

17. The semiconductor device of claim 15, wherein the first gate dielectric layer and the first conductive layer are a portion of a gate structure, wherein the gate structure includes a first side surface, and a second side surface, and wherein the alumina layer conforms to the first and second side surfaces of the first gate structure.

18. A semiconductor device comprising:
a first diffusion region formed in a substrate;
a second diffusion region formed in the substrate, the first and second diffusion regions being separated by a first channel region of the substrate;
a first word line formed over the first channel region;
a third diffusion region formed in the substrate, the third and second diffusion regions being separated by a second channel region of the substrate;
a second word line formed over the second channel region, wherein the first word line and the first and second diffusion regions form at least a portion of a first memory cell, and wherein the second word line and the second and third diffusion regions form at least a portion of a second memory cell;
a diffusion barrier formed over the first and second word lines, the diffusion barrier including an alumina layer, wherein the alumina layer remains in the semiconductor device after the semiconductor device is formed, wherein a first portion of the alumina layer completely covers a top surface of the first word line and completely covers a top surface of the second word line, wherein a second portion of the alumina layer is below the top surface of at least one of the first and second word lines, wherein the diffusion barrier layer includes a first insulating layer and a second insulating layer, wherein the alumina layer is between the first and second insulating layers, wherein each of the first and second insulating layers includes a first portion above the top surface of each of the first and second word lines, and wherein each of the first and second insulating layers includes a second portion below the top surface of at least one of the first and second word lines;

a first conductive contact structure coupled to the first diffusion region to provide electrical connection to the first diffusion region; and a second conductive contact structure coupled to the second diffusion region to provide electrical connection to the second diffusion region.

19. The semiconductor device of claim 18, wherein the diffusion barrier has a thickness, wherein the thickness has a range including a first range limit and a second range limit greater than the first range limit, and wherein the first range limit is about 20 Angstroms.

20. The semiconductor device of claim 18, wherein the first word line includes a first side surface and a second side surface, and wherein the diffusion barrier conforms to the first side surface and the second side surface.

21. The semiconductor device of claim 18, wherein the diffusion barrier further includes deuterium.

22. The semiconductor device of claim 18, wherein the alumina layer is formed between the insulating layer and the first and second word lines.

23. A semiconductor device comprising:
a first diffusion region formed in a substrate;
a second diffusion region formed in the substrate, the first and second diffusion regions being separated by a first channel region of the substrate;
a first gate structure formed over the first channel region;
a third diffusion region formed in the substrate, the third and second diffusion regions being separated by a second channel region of the substrate;
a second gate structure formed over the second channel region, wherein the first gate structure and the first and second diffusion regions form at least a portion of a first memory cell with the first diffusion region formed at least a portion of a storage node of the first memory cell, and wherein the second gate structure and the second and third diffusion regions form at least a portion of a second memory cell;
a dielectric layer formed over the first and second gate structures and the substrate;
a diffusion barrier for preventing diffusion between the dielectric layer and the first and second gate structures and for preventing diffusion between the dielectric layer and the substrate, the diffusion barrier including an alumina layer, wherein the alumina layer remains in the semiconductor device after the semiconductor device is formed, wherein the alumina layer completely covers a top surface of the first gate structure and completely covers a top surface of the second gate structure, wherein the diffusion barrier layer includes a first insulating layer and a second insulating layer, wherein the alumina layer is between the first and second insulating layers, wherein each of the first and second insulating layers includes a first portion above the top surface of each of the first and second gate structures, and wherein each of the first and second insulating layers includes a second portion below the top surface of at least one of the first and second gate structures;

a first conductive contact structure coupled to the first diffusion region to provide electrical connection to the first diffusion region; and a second conductive contact structure coupled to the second diffusion region to provide electrical connection to the second diffusion region.

24. The semiconductor device of claim 23, wherein the diffusion barrier has a thickness, wherein the thickness has a range including a first range limit and a second range limit greater than the first range limit, and wherein the first range limit is about 20 Angstroms.

25. The semiconductor device of claim 23, wherein the first gate structure includes multiple side surfaces, and wherein the diffusion barrier conforms to the multiple side surfaces.

26. The semiconductor device of claim 23, wherein the dielectric layer includes glass material.

27. The semiconductor device of claim 23, wherein the diffusion barrier further includes deuterium.

28. The semiconductor device of claim 23, wherein first, second, and third diffusion regions are consecutive diffusion regions in the substrate.

29. A semiconductor device comprising:
a first diffusion region formed in a substrate;
a second diffusion region formed in the substrate, the first and second diffusion regions being separated by a channel region of the substrate;
a gate structure formed over the channel region, wherein first diffusion region, the second diffusion region, and the gate structure form at least a portion of a memory cell with the first diffusion region formed at least a portion of a storage node of the memory cell;
a glass layer formed over the gate structure and the substrate;
an alumina layer formed between the glass layer and the gate structure, wherein the alumina layer remains in the semiconductor device layer after the semiconductor device is formed, and wherein a portion of the alumina layer is below a top surface of the gate structure;
a first insulating layer formed between the glass layer and the gate structure, wherein at least a first portion of the first insulating layer is formed above the top surface of the gate structure, and wherein at least a second portion of the first insulating layer is formed below the top surface of the gate structure; and
a second insulating layer formed between the glass layer and the gate structure, wherein at least a first portion of the second insulating layer is formed above the top surface of the gate structure, wherein at least a second portion of the second insulating layer is formed below the top surface of the gate structure, and wherein the alumina layer is between the first and second insulating layers.

30. The semiconductor device of claim 29, wherein the alumina layer has a thickness, wherein the thickness has a range including a first range limit and a second range limit greater than the first range limit, and wherein the first range limit is about 20 Angstroms.

31. A memory device comprising:
a plurality of memory cells arrange in rows and columns;
a row decoder coupled to the memory cells; and
a column decoder coupled to the memory cells, wherein the memory cells include:
a first diffusion region formed in a substrate;
a second diffusion region formed in the substrate, the first and second diffusion regions being separated by a first channel region of the substrate;
a first gate structure formed over the first channel region;
a third diffusion region formed in the substrate, the third and second diffusion regions being separated by a second channel region of the substrate;
a second gate structure formed over the second channel region, wherein the first gate structure and the first and second diffusion regions form at least a portion of a first memory cell of the plurality of memory cells with the first diffusion region formed at least a portion of a capacitor of the first memory cell, wherein a first potion of the second gate structure and the second and third diffusion regions form at least a portion of a second memory cell of the plurality of memory cells; and
an alumina layer formed over the gate structure, wherein the alumina layer remains in the semiconductor device after the memory device is formed, wherein a first portion of the alumina layer completely covers a top surface of the first gate structure and completely covers a top surface of the second gate structure, and wherein a second portion of the alumina layer is below the top surface of at least one of the first and second gate structures; and
a first insulating layer and a second insulating layer sandwiching the alumina layer, wherein each of the first and second insulating layers includes a first portion above the top surface of each of the first and second gate structures, and wherein each of the first and second insulating layers includes a second portion below the top surface of at least one of the first and second gate structures.

32. The memory device of claim 31, wherein the alumina layer has a thickness, wherein the thickness has a range including a first range limit and a second range limit greater than the first range limit, and wherein the first range limit is about 20 Angstroms.

33. The memory device of claim 31, wherein the first gate structure includes a side surface, and wherein the alumina layer conforms to the side surface of the gate structure.

34. The memory device of claim 31 further comprising a dielectric layer formed over the alumina layer.

35. The memory device of claim 34, wherein the dielectric layer includes glass material.

36. The memory device of claim 34, wherein the alumina layer is formed for preventing diffusion between the dielectric layer and the first and second gate structures and for preventing diffusion between the dielectric layer and the substrate.

37. A system comprising:
a processor; and
a semiconductor device connected to the processor, the semiconductor device including a plurality of memory cells, the memory cells including:
a first diffusion region formed in a substrate;
a second diffusion region formed in the substrate, the first and second diffusion regions being separated by a first channel region of the substrate;
a first gate structure formed over the first channel region;
a third diffusion region formed in the substrate, the third and second diffusion regions being separated by a second channel region of the substrate;
a second gate structure formed over the second channel region, wherein the first gate structure and the first and second diffusion regions form at least a portion of a first memory cell of the plurality of memory cells with the first diffusion region formed at least a portion of a capacitor of the first memory cell, and wherein the second gate structure and the second and third diffusion regions form at least a portion of a second memory cell of the plurality of memory cells; and an alumina layer formed over the gate structure, wherein the alumina layer remains in the semiconductor device after the memory device is formed, wherein a first portion of the alumina layer completely covers a top surface of the first gate structure and completely covers a top surface of the second gate structure, wherein a second portion of the alumina layer is below the top surface of at least one of the first and second gate structures; and a first insulating layer and a second insulating layer sandwiching the alumina layer, wherein each of the first and second insulating layers includes a first portion above the top surface of each of the first and second gate structures, and wherein each of the first and second insulating layers includes a second portion below the top surface of at least one of the first and second gate structures.

38. The system of claim 37, wherein the alumina layer has a thickness, wherein the thickness has a range including a first range limit and a second range limit greater than the first range limit, and wherein the first range limit is about 20 Angstroms.

39. The system of claim 37, wherein the first gate structure includes a side surface, and wherein the alumina layer conforms to the side surface of the first gate structure.

40. The system of claim 37 further comprising a glass layer formed over the alumina layer.

41. The system of claim 40, wherein the alumina layer is formed for preventing diffusion between the glass layer and the first gate structure and for preventing diffusion between the glass layer and the substrate.

42. A system comprising:
a processor; and
a memory device connected to the processor, the memory device including:
   a substrate;
   a plurality of diffusion regions formed in the substrate, the plurality of diffusion regions includes a first diffusion region, a second diffusion region, and a third diffusion region;
   a plurality of gate structures formed over the substrate, the plurality of gate structures includes a first gate structure formed over a channel region between the first and second diffusion regions, and a second gate structure formed over a channel region between the second and third diffusion regions, wherein the first gate structure and the first and second diffusion regions form at least a portion of a first memory cell of the memory device with the first diffusion region formed at least a portion of a capacitor of the first memory cell, and wherein the second gate structure and the second and third diffusion regions form at least a portion of a second memory cell of the memory device with the third diffusion region formed at least a portion of a capacitor of the second memory cell;
   a diffusion barrier including an alumina layer formed on the gate structures, wherein the alumina layer remains in the memory device after the memory device is formed, wherein a first portion of the alumina layer completely covers a top surface of the first gate structure and completely covers a top surface of the second gate structure, wherein a second portion of the alumina layer is below the top surface of at least one of the first and second gate structures, wherein the diffusion barrier layer includes a first insulating layer and a second insulating layer, wherein the alumina layer is between the first and second insulating layers, wherein each of the first and second insulating layers includes a first portion above the top surface of each of the first and second gate structures, and wherein each of the first and second insulating layers includes a second portion below the top surface of at least one of the first and second gate structures; and
   a glass layer formed on the diffusion barrier.

43. The system of claim 42, wherein the alumina layer conforms to the first and second gate structures and the substrate.

44. The system of claim 42, wherein the alumina layer has a thickness in a range of about 20 Angstroms to about 200 Angstroms.

45. The system of claim 42, wherein the diffusion barrier further includes deuterium.

46. The system of claim 45, wherein the deuterium is provided by using heavy water during a formation of the diffusion barrier.

47. The system of claim 42, wherein the first insulating layer includes material selected from the group consisting of silicon nitride and silicon dioxide.

48. The system of claim 42, wherein the first insulating layer has a thickness in a range of about 20 Angstroms to about 200 Angstroms.

49. The system of claim 42, wherein the diffusion barrier has a thickness in a range of about 20 Angstroms to about 400 Angstroms.

50. The system of claim 42, wherein the glass layer includes Borophosphosilicate glass (BPSG).

51. The system of claim 42, wherein the glass layer has a thickness of about 3000 Angstroms.

52. The system of claim 42, wherein the glass layer has a thickness in a range of 2000 to 5000 Angstroms.

* * * * *